US012568790B2

(12) United States Patent
Hwang et al.

(10) Patent No.: US 12,568,790 B2
(45) Date of Patent: Mar. 3, 2026

(54) SUBSTRATE PROCESSING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Young Ho Hwang, Hwaseong-si (KR); Eun Seok Seo, Gwangmyeong-si (KR); Jun O Park, Yongin-si (KR); Jae Hong Lim, Pyeongtaek-si (KR); Seok Heo, Busan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 697 days.

(21) Appl. No.: 17/847,090

(22) Filed: Jun. 22, 2022

(65) Prior Publication Data

US 2023/0178396 A1 Jun. 8, 2023

(30) Foreign Application Priority Data

Dec. 3, 2021 (KR) ......................... 10-2021-0171387

(51) Int. Cl.
| | |
|---|---|
| *H01L 21/67* | (2006.01) |
| *B05C 11/10* | (2006.01) |
| *G03F 7/16* | (2006.01) |

(52) U.S. Cl.
CPC .... *H01L 21/67248* (2013.01); *B05C 11/1015* (2013.01); *G03F 7/162* (2013.01); *G03F 7/168* (2013.01)

(58) Field of Classification Search
USPC ..................... 118/666, 667, 58, 52, 612, 500
See application file for complete search history.

(56) References Cited

U.S. PATENT DOCUMENTS

| | | | |
|---|---|---|---|
| 7,011,864 B2 * | 3/2006 | Ishida | ............... H01L 21/67207 427/407.1 |
| 7,425,689 B2 | 9/2008 | Kulp | |

(Continued)

FOREIGN PATENT DOCUMENTS

| | | |
|---|---|---|
| KR | 2008-0090823 A | 10/2008 |
| KR | 2008-0109981 A | 12/2008 |

(Continued)

OTHER PUBLICATIONS

Korean Office Action dated Nov. 13, 2025 issued in Korean Patent Application No. 10-2021-0171387.

*Primary Examiner* — Yewebdar T Tadesse
(74) *Attorney, Agent, or Firm* — Harness, Dickey & Pierce, P.L.C.

(57) ABSTRACT

Substrate processing apparatuses and methods of manufacturing a semiconductor device using the same may be provided. A substrate processing apparatus includes a heater in a support plate and comprising a first unit configured to heat a first portion of a substrate and a second unit configured to heat a second portion of a substrate, and processing circuitry configured to heat the heater in a transient section such that the first unit heats the first portion of the substrate to a first heating temperature, and the second unit heats the second portion of the substrate to a second heating temperature different from the first heating temperature, the transient section being a section before a temperature of the substrate reaches a steady state, a steady section being a section after the temperature of the substrate reaches the steady state.

18 Claims, 18 Drawing Sheets

(56)        References Cited

U.S. PATENT DOCUMENTS

| | | | |
|---|---|---|---|
| 7,831,135 | B2 | 11/2010 | Herchen |
| 8,772,682 | B2 | 7/2014 | Ambal et al. |
| 8,933,376 | B2 | 1/2015 | Fukuoka et al. |
| 10,886,151 | B2 | 1/2021 | Shigetomi et al. |
| 2020/0388496 | A1 | 12/2020 | Lee et al. |

FOREIGN PATENT DOCUMENTS

| | | | |
|---|---|---|---|
| KR | 10-2016-0009383 | A | 1/2016 |
| KR | 10-2020-0141581 | A | 12/2020 |

* cited by examiner

300

W

W2

W1

SUBSTRATE PROCESSING APPARATUS AND METHOD OF MANUFACTURING SEMICONDUCTOR DEVICE USING THE SAME

CROSS-REFERENCE TO RELATED APPLICATION

This application claims priority to Korean Patent Application No. 10-2021-0171387 filed on Dec. 3, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to substrate processing apparatuses and/or methods of manufacturing a semiconductor device using the same.

2. Description of the Related Art

As semiconductor devices and the like are more and more highly integrated, the sizes of various patterns constituting each device are becoming more miniaturized. Contrary to such a trend of miniaturization of the patterns of the semiconductor devices, the size of semiconductor wafers is more and more enlarged in terms of improvement of productivity. In spite of the miniaturization of the patterns, since the size of substrates such as semiconductor wafers and photomasks are more and more enlarged, an importance of uniformly forming and managing the critical dimension (CD) of device patterns that are repeatedly formed inside an enlarged semiconductor wafer or photomask over the entire position of the substrate is gradually increasing.

In order to form uniform and fine patterns, strict management of factors such as the temperature of the substrate is required. For example, detecting warpage of the substrate and the temperature of the substrate at each step of a process and implementing uniform process conditions in response to the warpage of the substrate and the temperature of the substrate are key factors in improving semiconductor manufacturing yield.

SUMMARY

Some aspects of the present disclosure provide methods of manufacturing a semiconductor device using a substrate processing apparatus capable of uniformly forming critical dimensions of patterns on a substrate by uniformly controlling the temperature of the substrate.

Some aspects of the present disclosure provide substrate processing apparatuses capable of uniformly forming critical dimensions of patterns on a substrate by uniformly controlling the temperature of the substrate.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an example embodiment, a substrate processing apparatus may include a spin unit comprising a coating unit configured to perform a process of coating a photoresist on a substrate, and a developing unit configured to perform a process of developing the substrate, a bake unit configured to perform a heat treatment process, and a transfer unit between the spin unit and the bake unit, wherein the bake unit comprises a process chamber comprising a processing space therein, a support plate configured to support the substrate in the process chamber, the substrate comprising a first portion and a second portion surrounding the first portion, a heater in the support plate, the heater comprising a first unit configured to heat the first portion of the substrate and a second unit configured to heat the second portion of the substrate, and processing circuitry configured to heat the heater in a transient section such that the first unit heats the first portion of the substrate to a first heating temperature, and the second unit heats the second portion of the substrate to a second heating temperature different from the first heating temperature, the transient section being a section before a temperature of the substrate reaches a steady state, a steady section being a section after the temperature of the substrate reaches the steady state.

According to an example embodiment, a substrate processing apparatus may include a process chamber comprising a processing space therein, a support plate configured to support a substrate in the process chamber, the substrate comprising a first portion and a second portion surrounding the first portion, a heater in the support plate, the heater comprising a first unit configured to heat the first portion of the substrate and a second unit configured to heat the second portion of the substrate, and processing circuitry configured to heat the heater in a transient section such that the first unit heats the first portion of the substrate to a first heating temperature, and the second unit heats the second portion of the substrate to a second heating temperature different from the first heating temperature, the transient section being a section before a temperature of the substrate reaches a steady state, a steady section being a section after the temperature of the substrate reaches the steady state.

According to an example embodiment, a substrate processing apparatus may include a process chamber comprising a processing space therein, a support plate configured to support a substrate in the process chamber, the substrate comprising a first portion, a second portion surrounding the first portion, and a third portion between the first portion and the second portion, a heater provided in the support plate, the heater comprising a first unit configured to heat the first portion of the substrate, a second unit configured to heat the second portion of the substrate, and a third unit configured to heat the third portion of the substrate, and processing circuitry configured to control the heater such that, in a transient section, the first unit heats the first portion of the substrate to a first heating temperature, the second unit heats the second portion of the substrate to a second heating temperature, and the third unit heats the third portion of the substrate to a third heating temperature, the transient section being a section before a temperature of the substrate reaches a steady state, a steady section being a section after the temperature of the substrate reaches the steady state, wherein the third heating temperature is lower than the first heating temperature, and the third heating temperature is higher than the second heating temperature.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments according to the technical spirit of the present disclosure will be described with reference to the accompanying drawings.

Figure 1:
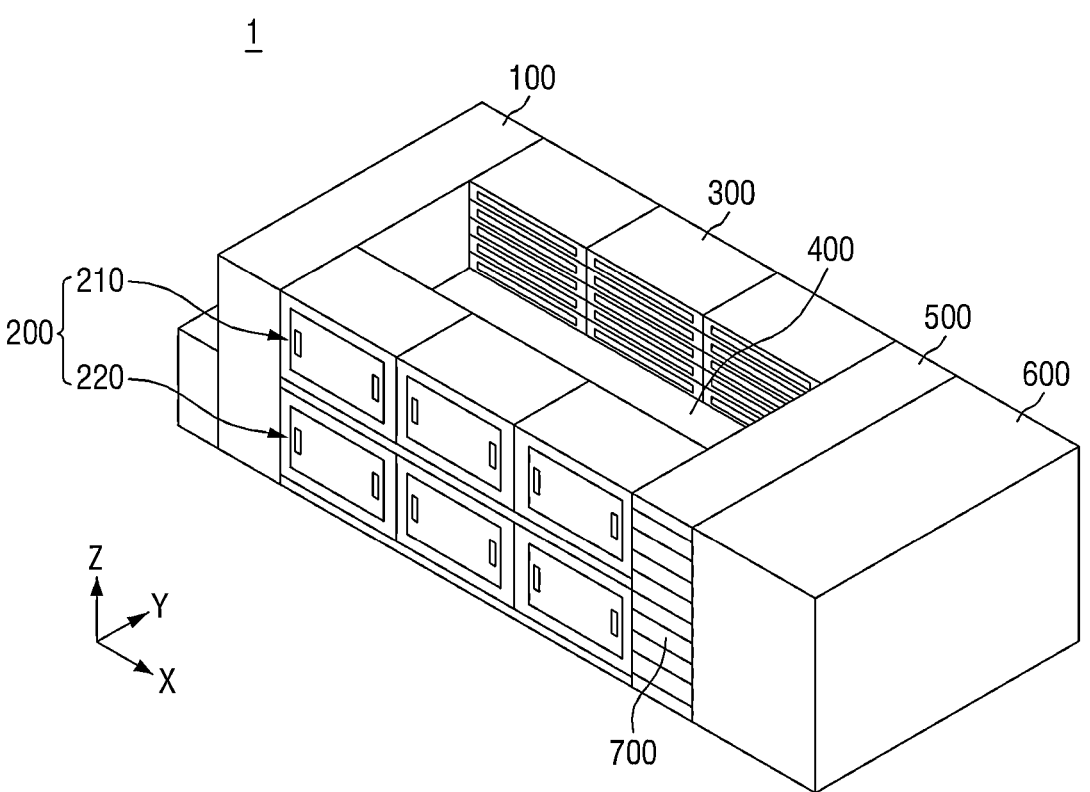
FIG. 1 is an example view for explaining a substrate processing apparatus according to an example embodiment of the present disclosure.
Figure 2:
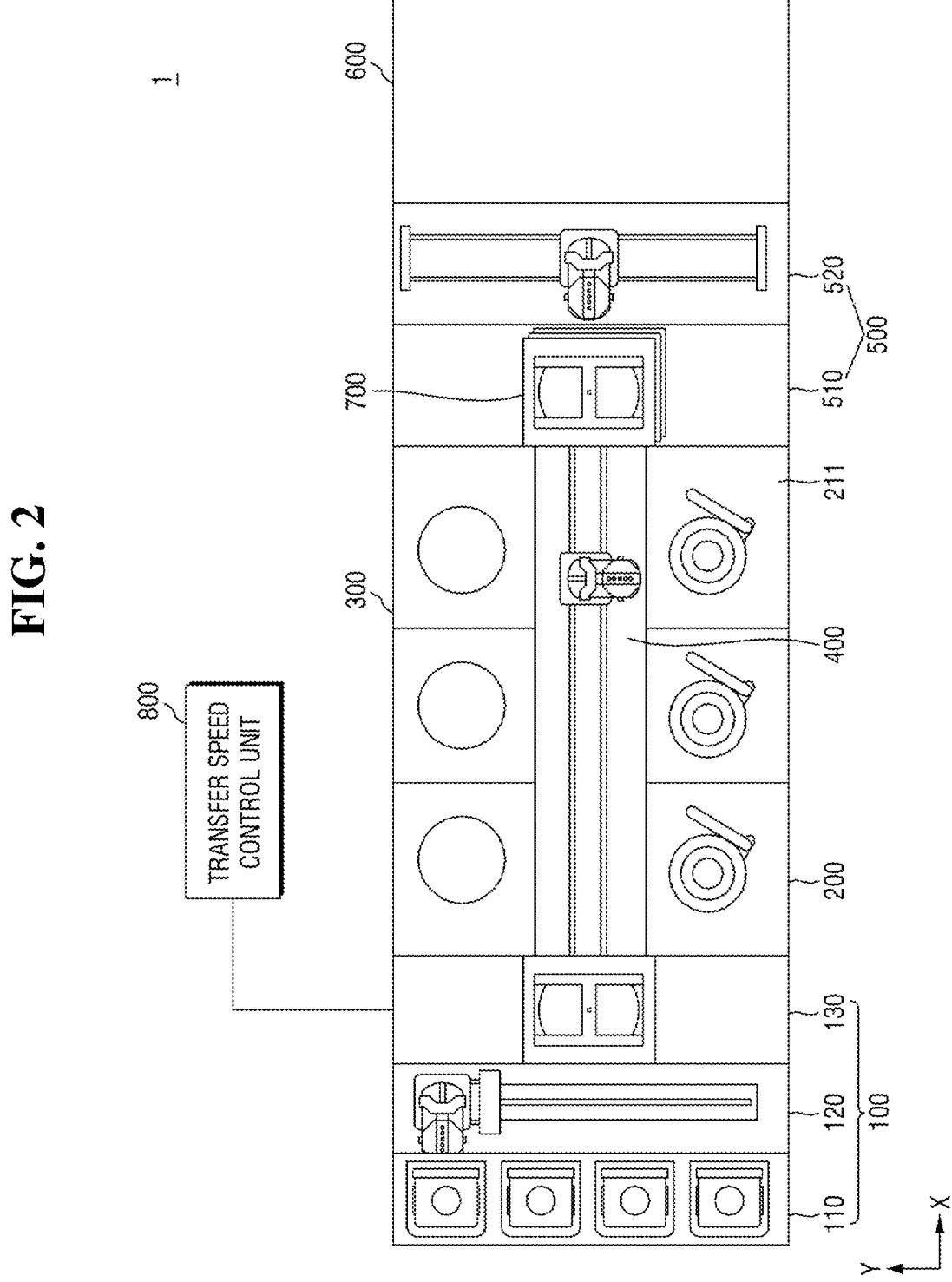
FIG. 2 is a plan view illustrating the substrate processing apparatus of FIG. 1.
Figure 3:
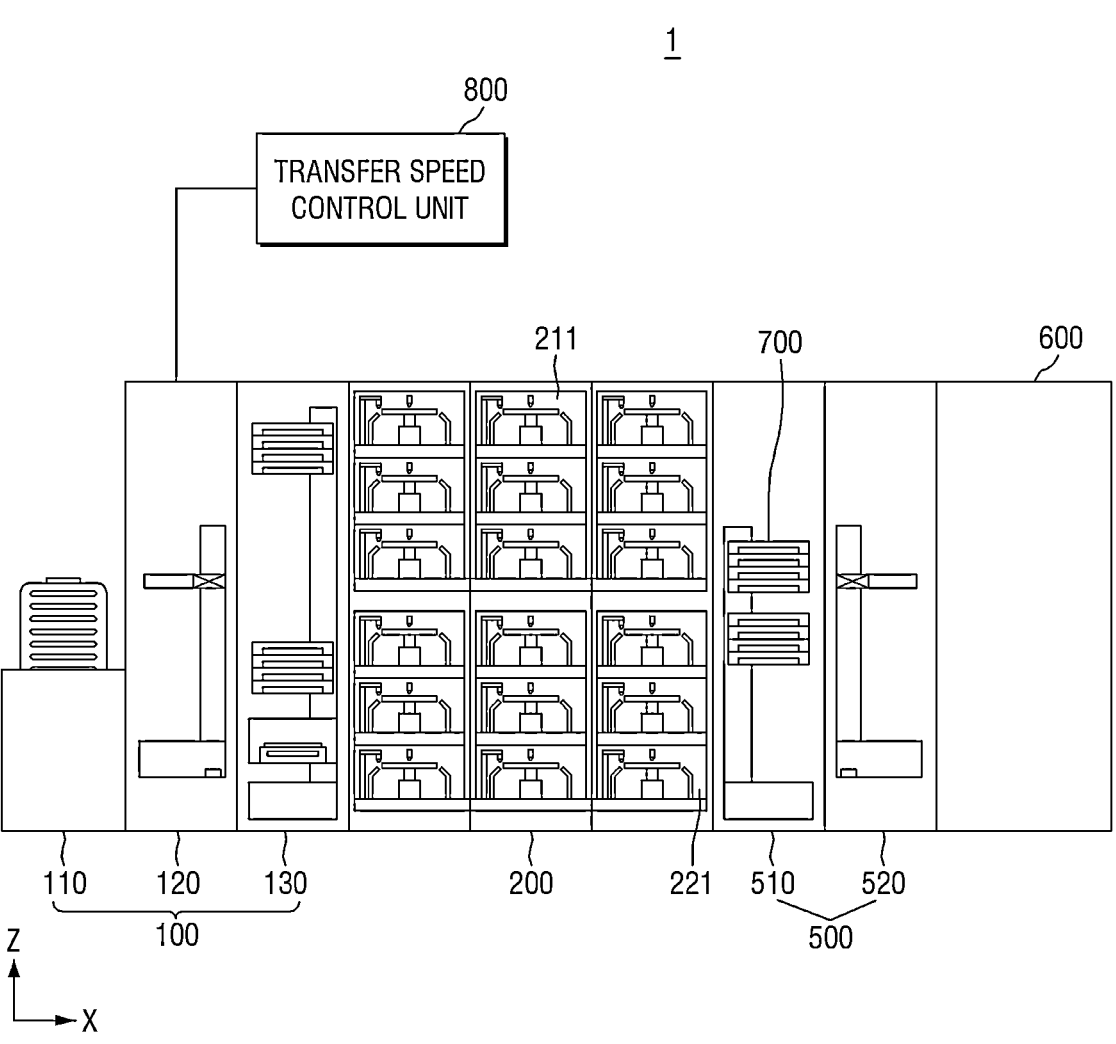
FIG. 3 is a side view illustrating the substrate processing apparatus of FIG. 1.

FIG. 1 is an example view for explaining a substrate processing apparatus according to an example embodiment of the present disclosure. FIG. 2 is a plan view illustrating the substrate processing apparatus of FIG. 1. FIG. 3 is a side view illustrating the substrate processing apparatus of FIG. 1.

Referring to FIGS. 1 to 3, a substrate processing apparatus 1 includes an index unit 100, a process processing unit (not illustrated), an interface unit 500, an exposure unit 600, a humidity control unit 700, and a transfer speed control unit 800. The process processing unit (not illustrated) includes a spin unit 200, a bake unit 300, and a transfer unit 400.

The index unit 100 may include a plurality of load ports 110, an index robot 120, and a first buffer module 130.

The load port 110 has a mounting table on which a cassette in which a substrate is accommodated is placed. The load port 110 may include a plurality of mounting tables, and the plurality of mounting tables may be arranged in a line along a second direction Y. In FIG. 2, the load port 110 is illustrated as including four mounting tables, but the example embodiment is not limited thereto. The number of mounting tables included in the load port 110 may be changed according to an example embodiment.

The index robot 120 transfers a substrate W between the load port 110 and the first buffer module 130. The index robot 120 may include a frame, a transfer robot, and a guide rail. The frame is generally provided in the shape of a rectangular parallelepiped with an empty interior, and is disposed between the load port 110 and the first buffer module 130. The transfer robot and guide rail are disposed in a frame. The transfer robot may include a structure capable of four-axis driving so as to be movable and rotated in a first direction X, a second direction Y, and a third direction Z.

The first buffer module 130 may be provided in the shape of a rectangular parallelepiped with an empty interior for temporarily storing a plurality of substrates W. The first buffer module 130 may be disposed between the index robot 120 and the process processing unit including the spin unit 200, the bake unit 300, and the transfer unit 400.

The spin unit 200 may include a coating unit 210 that performs a process of coating a photoresist on the substrate W before an exposure process, and a developing unit 220 that performs a process of developing the substrate W after the exposure process. The coating unit 210 and the developing unit 220 may be disposed to be partitioned into layers. For example, the coating unit 210 may be disposed on an upper side of the developing unit 220. As another example, the coating unit 210 may be disposed on a lower side of the developing unit 220.

The coating unit 210 performs a process of coating a coating solution, such as a photoresist, on the substrate W. The coating unit 210 may include a plurality of coating chambers 211. The coating chambers 211 of the coating unit 210 may be continuously disposed along the first direction X, and may be stacked along the third direction Z. The plurality of coating chambers 211 may all have the same structure. The type of photoresist used in each coating chamber 211 may be different from each other.

In FIGS. 2 and 3, it is illustrated that three coating chambers 211 are disposed along each of the first direction X and the third direction Z, but the example embodiment is not limited thereto. The number of coating chambers 211 disposed along the first direction X and the third direction Z may be variously changed according to example embodiments.

The developing unit 220 performs a developing process of removing a portion of the photoresist by supplying a developer to obtain a pattern on the substrate W. The developing unit 220 may remove an area of the photoresist on the substrate W irradiated with light. Depending on the type of the selectively used photoresist, only an area of the photoresist to which no light is irradiated may be removed.

The developing unit 220 may include a plurality of developing chambers 221. The developing chambers 221 of the developing unit 220 may be continuously disposed along the first direction X, and may be stacked along the third direction Z. The plurality of developing chambers 221 may all have the same structure. The type of developer used in each developing unit 220 may be different from each other.

In FIGS. 2 and 3, it is illustrated that three developing chambers 221 are disposed along each of the first direction X and the third direction Z, but the example embodiment is not limited thereto. The number of developing chambers 221 disposed along the first direction X and the third direction Z may be variously changed according to example embodiments.

The bake unit 300 performs a heat treatment process for heating or cooling the substrate W. The bake unit 300 may perform a pre-bake process of heating the substrate W to a desired (or alternatively, predetermined) temperature before coating the photoresist to remove organic matter or moisture from a surface of the substrate W, a soft bake process performed after coating the photoresist on the substrate W, a post-bake process of heating the substrate W before the developing process is performed, a hard bake process of heating the substrate W after the developing process is performed, a cooling process of cooling the heated wafer after each bake process, and the like.

The bake unit 300 may include a plurality of baking chambers. The baking chambers of the bake unit 300 may be continuously disposed along the first direction X, and may be stacked along the third direction Z. In FIG. 2, it is illustrated that three baking chambers are disposed along the first direction X and six baking chambers are stacked along the third direction Z, but the example embodiment is not limited thereto. The number of baking chambers disposed along the first direction X and the third direction Z may be variously modified according to example embodiments.

The baking chamber has a cooling plate or a heating plate. The cooling plate may be provided with a cooling element such as cooling water or a thermoelectric element. The heating plate may be provided with heating element such as a heating wire or a thermoelectric element. Some of the plurality of baking chambers may have only the cooling plate, and other baking chambers may have only the heating plate. In addition, one baking chamber may have both the cooling plate and the heating plate.

The bake unit 300 will be described in detail with reference to FIGS. 4 to 16 below.

The transfer unit 400 is disposed parallel to the first buffer module 130 and a second buffer module 510 in the first direction X. A process processing unit robot and a guide rail are positioned in the transfer unit 400. The transfer unit 400 has a generally rectangular shape. The process processing unit robot transfers the substrate W between the first buffer module 130, the coating unit 210, the developing unit 220, the bake unit 300, and the second buffer module 510. The guide rail extends along the first direction X. The guide rail guides the process processing unit robot so that the process processing unit robot linearly moves in the first direction X.

The spin unit 200, the transfer unit 400, and the bake unit 300 are disposed along the second direction Y. That is, the coating unit 210 and the developing unit 220 are positioned to face the bake unit 300 with the transfer unit 400 interposed therebetween.

The interface unit 500 may transfer the substrate W between the exposure unit 600 and the process processing unit (not illustrated) including the spin unit 200, the bake unit 300, and the transfer unit 400. The interface unit 500 may include a second buffer module 510 and an interface robot 520.

The second buffer module 510 may temporarily store the substrate W. The second buffer module 510 may include a plurality of chambers (corresponding to a "first buffer chamber" and a "second buffer chamber") for accommodating the substrate W. The first buffer chamber may temporarily store the substrate W transferred from the process processing unit (e.g., the coating unit) to the exposure unit 600. The second buffer chamber may temporarily store the substrate W transferred from the exposure unit 600 to the process processing unit (e.g., the bake unit).

A shape in which the first buffer chamber and the second buffer chamber are disposed in the second buffer module 510 may be changed according to example embodiments. For example, the first buffer chamber and the second buffer chamber may be stacked in the second buffer module 510 along the third direction Z.

As another example, the first buffer chamber and the second buffer chamber may be disposed side by side in the first direction X or the second direction Y. In this case, a plurality of first buffer chambers may be stacked to form a first buffer tower, and a plurality of second buffer chambers may be stacked to form a second buffer tower. That is, the first buffer tower and the second buffer tower may be arranged side by side in the first direction X or the second direction Y.

The second buffer module 510 may include a chamber in which the substrate W is not accommodated. In addition, the humidity control unit 700 may be disposed in the second buffer module 510. This will be described in detail below.

The interface robot 520 may transfer the substrate W between the second buffer module 510 and the exposure unit 600.

The exposure unit 600 may irradiate the substrate W on which a photoresist film is formed with light using a stepper to form a circuit pattern on the substrate W.

The humidity control unit 700 may control an amount of moisture to which the substrate W is exposed so that a performance of the substrate W is not reduced when the substrate W passes through the humidity control unit 700. The humidity control unit 700 may supply steam to increase a total amount of moisture to which the substrate W is exposed in the substrate processing apparatus 1.

In some example embodiments, the humidity control unit 700 may be disposed in the second buffer module 510 of the interface unit 500. That is, the humidity control unit 700 may be disposed in the plurality of chambers of the second buffer module 510. For example, the humidity control unit 700 may be stacked with the first buffer chamber and the second buffer chamber of the second buffer module 510 in the third direction Z. As another example, the humidity control unit 700 may be disposed between the first buffer chamber and the second buffer chamber of the second buffer module 510 in the first direction X or the second direction Y.

In this case, the humidity control unit 700 may control the total amount of moisture to which the substrate W provided from the spin unit 200 to the exposure unit 600 is exposed. When the substrate W passes through the humidity control unit 700 compared to before passing through the humidity control unit 700, the amount of moisture to which the substrate W is exposed sharply increases.

The transfer speed control unit 800 may control a speed at which the index robot 120, the transfer unit 400, and the interface robot 520 transfer the substrate W in the substrate processing apparatus 1. For example, when the substrate W is transferred from the spin unit 200 to the bake unit 300 through the transfer unit 400, the transfer speed control unit 800 may control a transfer speed of the substrate W.

Hereinafter, the bake unit 300 included in the substrate processing apparatus according to some example embodiments will be described in more detail with reference to FIGS. 4 to 16.

Figure 4:
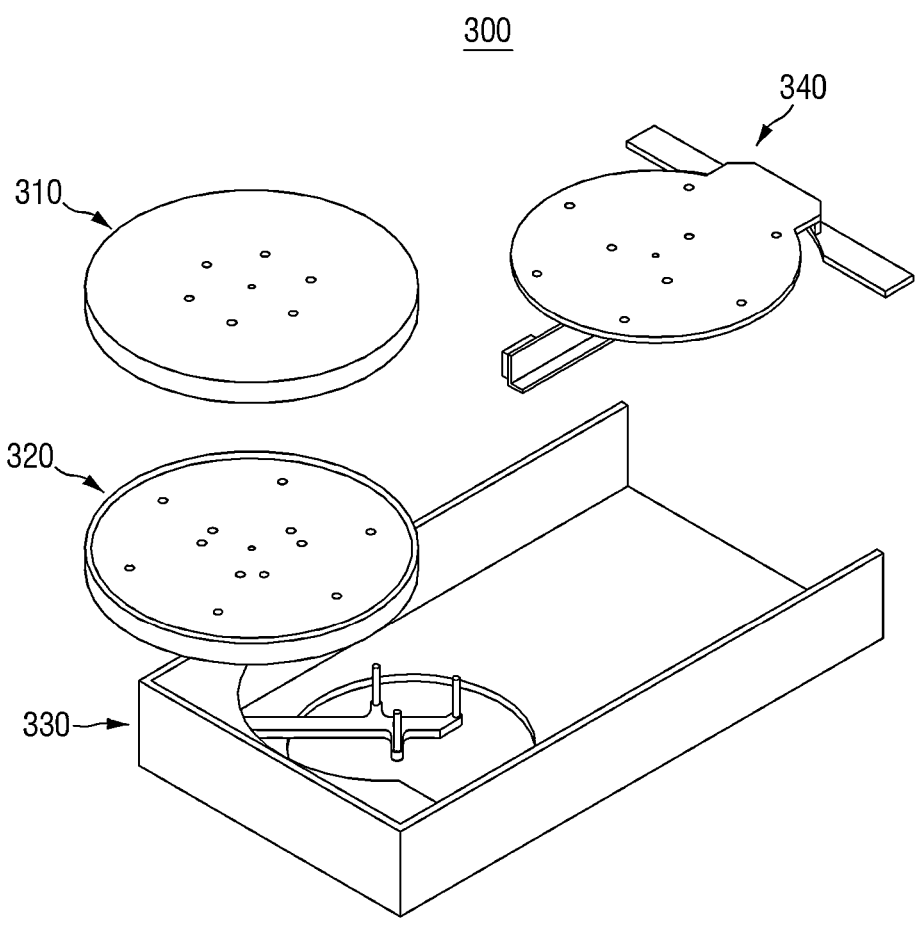
FIGS. 4 and 5 are an example perspective view and an example cross-sectional view for explaining the bake unit of FIG. 1.
Figure 5:
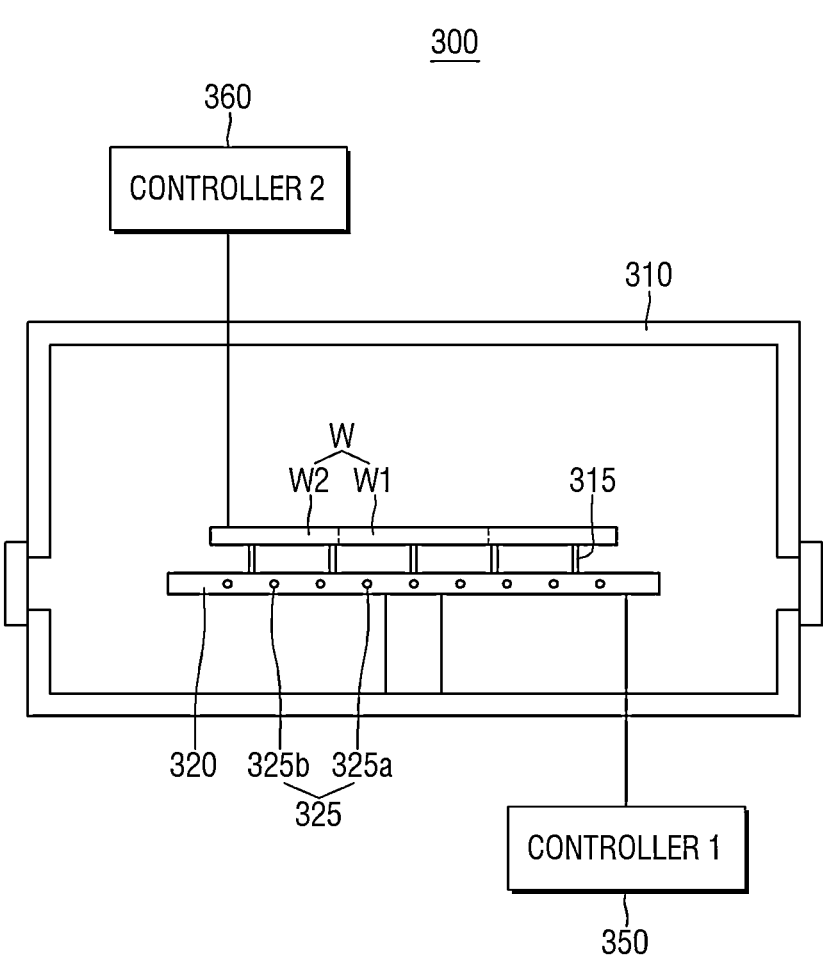
Figure 6:
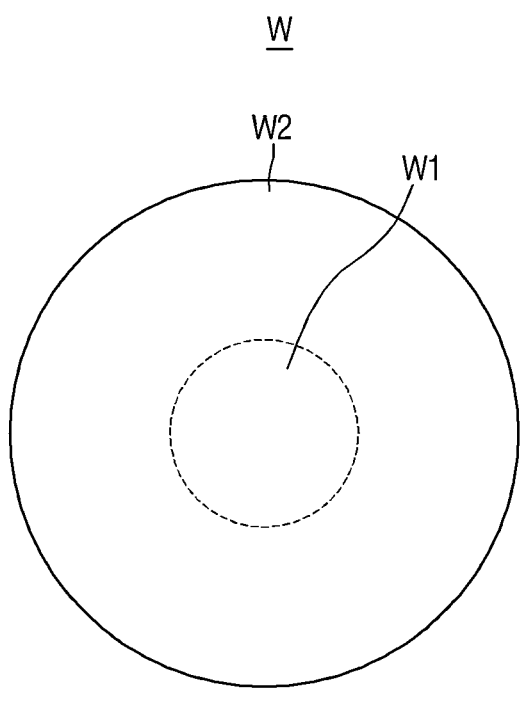
FIG. 6 is a view for explaining the substrate of FIG. 5.

FIGS. 4 and 5 are an example perspective view and an example cross-sectional view for explaining the bake unit of FIG. 1. FIG. 6 is a view for explaining the substrate of FIG. 5.

First, referring to FIG. 4, the bake unit 300 may include a process chamber 310, a support plate 320, a base module 330, and a carrier robot 340.

The carrier robot 340 may introduce the substrate W (FIG. 5) into the bake unit 300, or may carry out the processed substrate W from the bake unit 300. The process chamber 310 may include an exhaust structure for exhausting gas generated while the substrate W is heated. The process chamber 310 may isolate the substrate W from the outside while the process is in progress. The process chamber 310 may block or prevent heat for processing the substrate W from leaking to the outside. In addition, the process chamber 310 may block or prevent the substrate W from being contaminated by particles outside the process chamber 310. The process chamber 310 may also cover both the support plate 320 and the substrate W, or may be configured to cover only the substrate W.

The base module 330 may support various components included in the bake unit 300 such as the support plate 320 and the process chamber 310.

When the substrate W is transferred by the carrier robot 340, the process chamber 310 may be opened. Subsequently, the substrate W may be mounted on the support plate 320 through the carrier robot 340 and the process chamber 310 may be closed. Subsequently, when the substrate W is sufficiently heated, the process chamber 310 may be opened again, and the substrate W may be carried out by the carrier robot 340.

Referring to FIG. 5, the bake unit 300 may include the process chamber 310, the support plate 320, support pins 315, a first control unit 350, and a second control unit 360.

The process chamber 310 may have a processing space provided therein. Various semiconductor processes may be performed on the substrate W in the processing space. For example, a bake process may be performed on the substrate W in the processing space. The substrate W may be heated by a heating unit 325 provided in the support plate 320. Although not illustrated, the process chamber 310 may include an opening. The substrate W may be carried in and out through the opening.

Referring to FIG. 6, the substrate W may be provided. The substrate W may include a first portion W1 and a second portion W2. The first portion W1 may be a central portion of the substrate W, and the second portion W2 may be an edge portion of the substrate W. The second portion W2 may surround the first portion W1, but is not limited thereto.

Referring back to FIG. 5, the substrate W may be placed on the support plate 320. The substrate W may be mounted on the support plate 320. Specifically, the support pins 315 on the support plate 320 may support the substrate W. When the substrate W is loaded onto the support plate 320, the support pins 315 may be positioned inside the support plate 320. After the substrate W is loaded onto the support plate 320, the support pins 315 may rise to separate the substrate W from the support plate 320.

The support plate 320 may be connected to the process chamber 310. The support plate 320 may support the substrate W. In some example embodiments, the support plate 320 may include the support pins 315. The support pins 315 may be positioned inside the support plate 320 before the substrate W is loaded. After the substrate W is loaded, the support pins 315 may rise in a vertical direction to support the substrate W. In FIG. 5, a width of the support plate 320 is illustrated as being greater than a width of the substrate W, but it is only for convenience of description and the present disclosure is not limited thereto.

In some example embodiments, the support plate 320 may include the heating unit 325. The heating unit 325 may be provided in the support plate 320. However, the heating unit 325 is not limited thereto, and may also be provided on the support plate 320. The heating unit 325 may heat the substrate W. For example, the heating unit 325 may heat the substrate W to a set temperature. The heating unit 325 may be, for example, a heat transfer device, and may have any of various shapes to provide uniform heat to the substrate W mounted on the support plate 320.

In some example embodiments, there may be more than one heating unit 325. The heating unit 325 may be partitioned into a plurality of areas corresponding to a plurality of areas of the substrate W. For example, the heating unit 325 may include a first unit 325a and a second unit 325b. The first unit 325a may be a heating unit that heats the first portion W1 of the substrate W. The second unit 325b may be a heating unit that heats the second portion W2 of the substrate W. The first unit 325a and the second unit 325b may generate different heat outputs. For example, the first unit 325a may heat the first portion W1 of the substrate W at a first heating temperature, and the second unit 325b may heat the second portion W2 of the substrate W at a second heating temperature different from the first heating temperature. As the first heating temperature of the first unit 325a and the second heating temperature of the second unit 325b are different, the substrate W may be uniformly heated. Accordingly, patterns having uniform critical dimensions may be formed on the substrate W. In this regard, it will be described in detail with reference to FIGS. 7 to 10.

Although not illustrated, a plurality of vacuum ports through which vacuum pressure is provided from the outside may be disposed in the support plate 320. The plurality of vacuum ports may serve as a path through which vacuum pressure is provided through the support plate 320. The vacuum ports may be formed in the support plate 320 to have various arrangements. The vacuum ports may suck the substrate W through the vacuum pressure so that the substrate W is fixed on the plurality of support pins 315.

The first control unit 350 may be connected to the support plate 320. The first control unit 350 may control the heating unit 325 in the support plate 320. For example, the first control unit 350 may control the heating temperature of the heating unit 325. For example, a temperature sensor may be embedded in the support plate 320. However, a position of the temperature sensor is not limited thereto, and the temperature sensor may also be disposed on an upper surface or a lower surface of the support plate 320. The temperature sensor may sense a heating temperature of the heating unit 325 that heats the substrate W and transmit the sensed heating temperature to the first control unit 350. The first control unit 350 may adjust and control the heating temperatures of the heating units 325a and 325b according to the received heating temperature of the heating unit 325.

The second control unit 360 may be connected to the substrate W. The second control unit 360 may be, for example, a temperature sensor sensing a temperature of the substrate W, but is not limited thereto. The second control unit 360 may sense the temperature of the substrate W and transmit sensed information to the first control unit 350.

Figure 7:
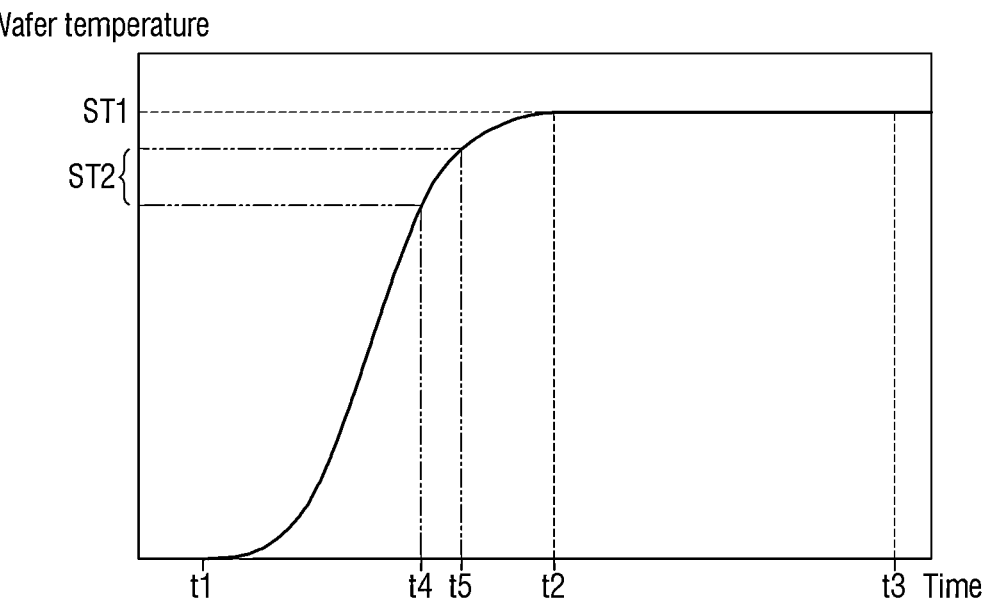
FIG. 7 is an example graph for explaining a temperature of a substrate heated using the bake unit of FIG. 1.

FIG. 7 is an example graph for explaining a temperature of a substrate heated using the bake unit of FIG. 1. For reference, an x-axis may mean time, and a y-axis may mean a temperature of a substrate.

Referring to FIG. 7, as the substrate W is loaded into the substrate processing apparatus and time passes, the temperature of the substrate may increase. That is, the substrate W may be heated using the heating unit 325. The heating of the substrate W may include a transient section and a steady section.

The transient section may be a section before the temperature of the substrate W reaches a steady state. The steady section may be a section after the temperature of the substrate W reaches the steady state. The "steady state" may mean a state in which the temperature of the substrate W reaches a first substrate temperature ST1 and stays at the first substrate temperature ST1. The first substrate temperature ST1 may be a temperature of the substrate W at which an efficient process is possible. For example, the first substrate temperature ST1 may be 80° C. or more and 120° C. or less. For example, the first substrate temperature ST1 may be 90° C., but is not limited thereto. That is, the steady section may be a section between a second time t2 and a third time t3. The transient section may be a section between a first time t1 and the second time t2.

For example, the substrate W may be loaded into the substrate processing apparatus at the first time t1. The temperature of the substrate W may increase in a section corresponding to between the first time t1 and the second time t2. For example, the temperature of the substrate W may rise to the first substrate temperature ST1. After the second time t2 has elapsed, the temperature of the substrate W may be maintained at the first substrate temperature ST1.

In some example embodiments, the transient section may include a concentration section. The concentration section may mean a section in which the heating temperature for heating the substrate W is adjusted. The substrate processing apparatus according to some example embodiments may adjust the heating temperature of the substrate W by using the heating unit 325 in the support plate 320. The heating unit 325 may adjust the heating temperature in the concentration section.

In some example embodiments, the concentration section may be a section between a fourth time t4 and a fifth time t5. In the concentration section, the substrate W may have a second substrate temperature ST2. The second substrate temperature ST2 may be lower than the first substrate temperature ST1. A difference between the first substrate temperature ST1 and the second substrate temperature ST2 may be, for example, 5° C. to 10° C., but is not limited thereto. That is, the heating unit of the substrate processing apparatus according to some example embodiments may adjust the heating temperature in a temperature section as low as about 5° C. to 10° C. from the temperature of the steady state of the substrate W.

Figure 8:
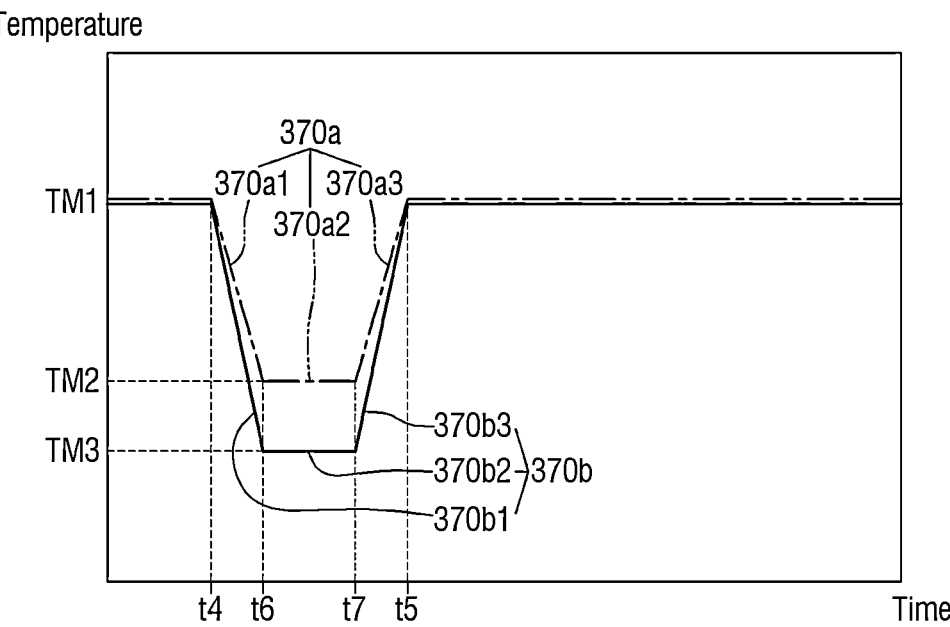
FIG. 8 is an example graph for explaining a heating temperature of the heating unit of FIG. 4.

FIG. 8 is an example graph for explaining a heating temperature of the heating unit of FIG. 4. For reference, an x-axis may mean time, and a y-axis may mean a temperature of the heating unit.

Referring to FIG. 8, a first graph 370a and a second graph 370b are provided. The first graph 370a may be a graph indicating a first heating temperature at which the first unit 325a heats the first portion W1 of the substrate W, and the second graph 370b may be a graph indicating a second heating temperature at which the second unit 325b heats the second portion W2 of the substrate W.

As described above, the first unit 325a may heat the first portion W1 of the substrate W. The first unit 325a may heat the first portion W1 of the substrate W to a first heating temperature. The first heating temperature may have a value between a first temperature TM1 and a second temperature TM2. The second unit 325b may heat the second portion W2 of the substrate W. The second unit 325b may heat the second portion W2 of the substrate W to a second heating temperature. The second heating temperature may have a value between the first temperature TM1 and a third temperature TM3.

In some example embodiments, the second temperature TM2 may be greater than the third temperature TM3. That is, the first heating temperature when the first portion W1 of the substrate W is heated may be greater than the second heating temperature when the second portion W2 of the substrate W is heated. In other words, the central portion of the substrate W may be heated to a higher temperature than the edge portion of the substrate W.

The temperature of the central portion of the substrate W may be lower than the temperature of the edge portion of the substrate W. In addition, the central portion of the substrate W may be heated more slowly than the edge portion of the substrate W. As the central portion of the substrate W is heated to a higher temperature than the edge portion of the substrate W, the substrate W may be heated to a uniform temperature. As described above, as the heating temperature of the heating unit 325 is adjusted according to the area of the substrate W, the substrate W may be uniformly heated in the substrate processing apparatus. Accordingly, the critical dimension (CD) of the patterns formed on the substrate W in a subsequent process may be uniformly formed.

In some example embodiments, the first heating temperature may have first to third sub-sections 370a1, 370a2, and 370a3 according to a profile of temperature. The first to third sub-sections 370a1, 370a2, and 370a3 may be included in a concentration section (a section from a fourth time t4 to a fifth time t5) of a transient section. The first sub-section 370a1 may be a section between the fourth time t4 and a sixth time t6. The second sub-section 370a2 may be a section between the sixth time t6 and a seventh time t7. The third sub-section 370a3 may be a section between the seventh time t7 and the fifth time t5.

In some example embodiments, the first heating temperature may be gradually decreased in the first sub-section 370a1. The first heating temperature may be constant in the second sub-section 370a2. The first heating temperature may be gradually increased in the third sub-section 370a3.

That is, in the first sub-section 370a1, the first heating temperature of the first unit 325a may be gradually lowered from the first temperature TM1 to the second temperature TM2. As time passes from the fourth time t4 to the sixth time t6, the first heating temperature of the first unit 325a may be gradually lowered from the first temperature TM1 to the second temperature TM2.

In the second sub-section 370a2, the first heating temperature of the first unit 325a may be the second temperature TM2. As time passes from the sixth time t6 to the seventh time t7, the first heating temperature of the first unit 325a may be constantly maintained at the second temperature TM2.

In the third sub-section 370a3, the first heating temperature of the first unit 325a may gradually increase from the second temperature TM2 to the first temperature TM1. As time passes from the seventh time t7 to the fifth time t5, the first heating temperature of the first unit 325*a* may gradually increase from the second temperature TM2 to the first temperature TM1.

In some example embodiments, the second heating temperature may have fourth to sixth sub-sections 370*b*1, 370*b*2, and 370*b*3 according to a profile of temperature. The fourth to sixth sub-sections 370*b*1, 370*b*2, and 370*b*3 may be included in the concentration section (the section from the fourth time t4 to the fifth time t5) of the transient section. The second heating temperature may be gradually decreased in the fourth sub-section 370*b*1. The second heating temperature may be constant in the fifth sub-section 370*b*2. The second heating temperature may be gradually increased in the sixth sub-section 370*b*3.

For example, the fourth sub-section 370*b*1 may be a section between the fourth time t4 and the sixth time t6. The fifth sub-section 370*b*2 may be a section between the sixth time t6 and the seventh time t7. The sixth sub-section 370*b*3 may be a section between the seventh time t7 and the fifth time t5.

In the fourth sub-section 370*b*1, the second heating temperature of the second unit 325*b* may be gradually lowered from the first temperature TM1 to the third temperature TM3. As time passes from the fourth time t4 to the sixth time t6, the second heating temperature of the second unit 325*b* may be gradually lowered from the first temperature TM1 to the third temperature TM3.

In the fifth sub-section 370*b*2, the second heating temperature of the second unit 325*b* may be the third temperature TM3. As time passes from the sixth time t6 to the seventh time t7, the second heating temperature of the second unit 325*b* may be constantly maintained at the third temperature TM3.

In the sixth sub-section 370*b*3, the second heating temperature of the second unit 325*b* may gradually increase from the third temperature TM3 to the first temperature TM1. As time passes from the seventh time t7 to the fifth time t5, the second heating temperature of the second unit 325*b* may gradually increase from the third temperature TM3 to the first temperature TM1.

In some example embodiments, the first sub-section 370*a*1 of the first heating temperature may completely overlap the fourth sub-section 370*b*1 of the second heating temperature. The second sub-section 370*a*2 of the first heating temperature may completely overlap the fifth sub-section 370*b*2 of the second heating temperature. The third sub-section 370*a*3 of the first heating temperature may completely overlap the sixth sub-section 370*b*3 of the second heating temperature. However, the present disclosure is not limited thereto.

Figure 9:
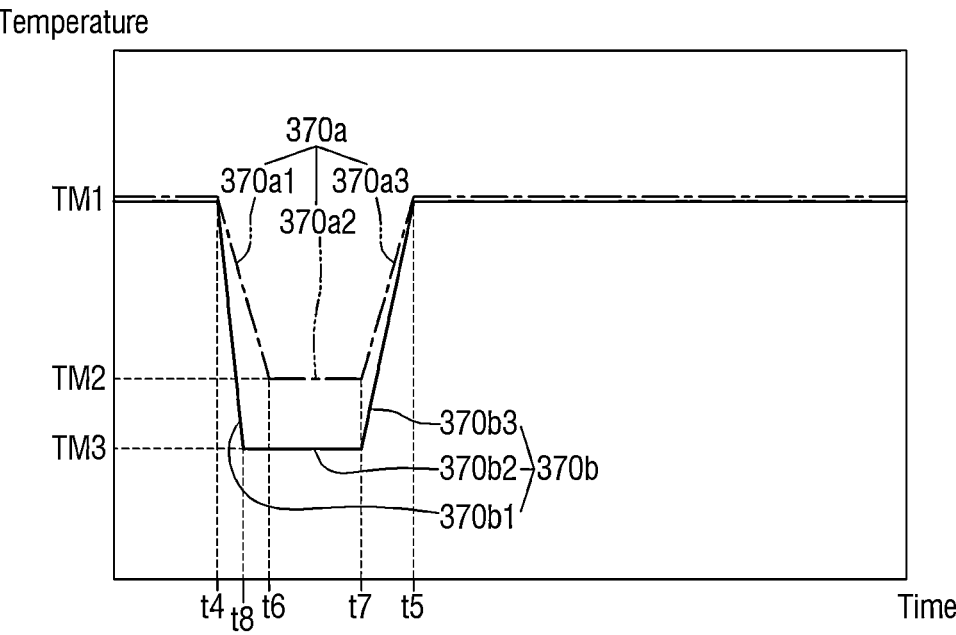
FIGS. 9 and 10 are graphs for explaining heating temperatures of the heating unit according to some example embodiments.
Figure 10:
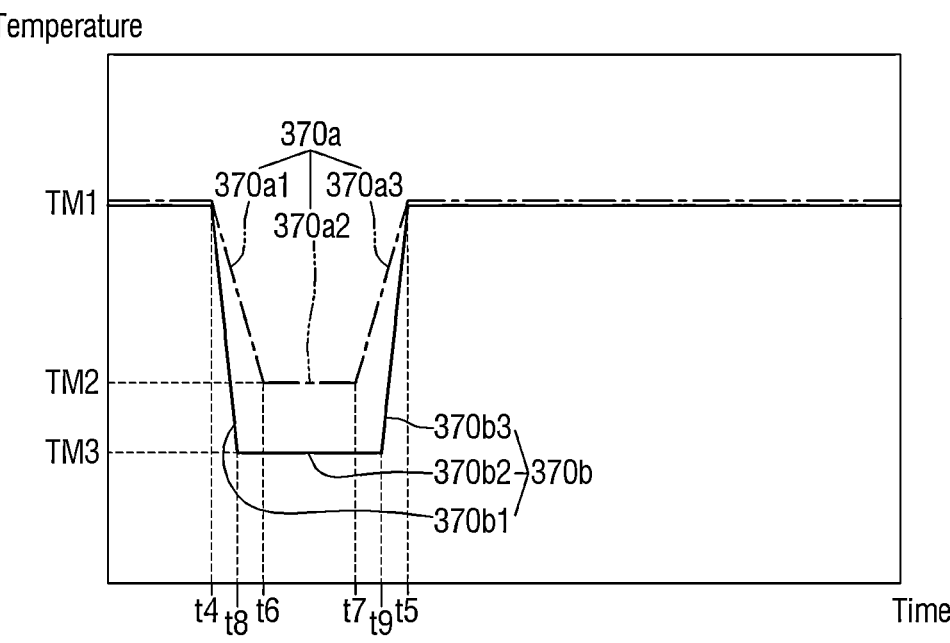

FIGS. 9 and 10 are graphs for explaining a heating temperature of the heating unit according to some example embodiments. For convenience of explanation, the contents overlapping those described with reference to FIG. 8 will be omitted.

Referring to FIG. 9, the fifth sub-section 370*b*2 may include a portion that does not overlap the second sub-section 370*a*2. In this case, the first sub-section 370*a*1 may include a portion that does not overlap the fourth sub-section 370*b*1. The third sub-section 370*a*3 may completely overlap the sixth sub-section 370*b*3.

For example, the fourth sub-section 370*b*1 may be a section between the fourth time t4 and an eighth time t8. The fifth sub-section 370*b*2 may be a section between the eighth time t8 and the seventh time t7. The eighth time t8 may be located between the fourth time t4 and the sixth time t6. Accordingly, the first sub-section 370*a*1 is longer than the fourth sub-section 370*b*1 in terms of time. The second sub-section 370*a*2 is shorter than the fifth sub-section 370*b*2 in terms of time.

Referring to FIG. 10, the first sub-section 370*a*1 may include a portion that does not overlap the fourth sub-section 370*b*1. The fifth sub-section 370*b*2 may include a portion that does not overlap the second sub-section 370*a*2. The third sub-section 370*a*3 may include a portion that does not overlap the sixth sub-section 370*b*3.

For example, the fourth sub-section 370*b*1 may be a section between the fourth time t4 and an eighth time t8. The fifth sub-section 370*b*2 may be a section between the eighth time t8 and a ninth time t9. The sixth sub-section 370*b*3 may be a section between the ninth time t9 and the fifth time t5. The eighth time t8 may be located between the fourth time t4 and the sixth time t6. The ninth time t9 may be located between the seventh time t7 and the fifth time t5. Accordingly, the first sub-section 370*a*1 is longer than the fourth sub-section 370*b*1 in terms of time. The second sub-section 370*a*2 is shorter than the fifth sub-section 370*b*2. The third sub-section 370*a*3 is longer than the sixth sub-section 370*b*3 in terms of time.

Although not illustrated, the first sub-section 370*a*1 may be shorter than the fourth sub-section 370*b*1 in terms of time. The second sub-section 370*a*2 may be longer than the fifth sub-section 370*b*2 in terms of time. The third sub-section 370*a*3 may be shorter than the sixth sub-section 370*b*3 in terms of time. The first heating temperature for heating the first portion W1 of the substrate W and the second heating temperature for heating the second portion W2 of the substrate W may be freely changed depending on process conditions.

Figure 11:
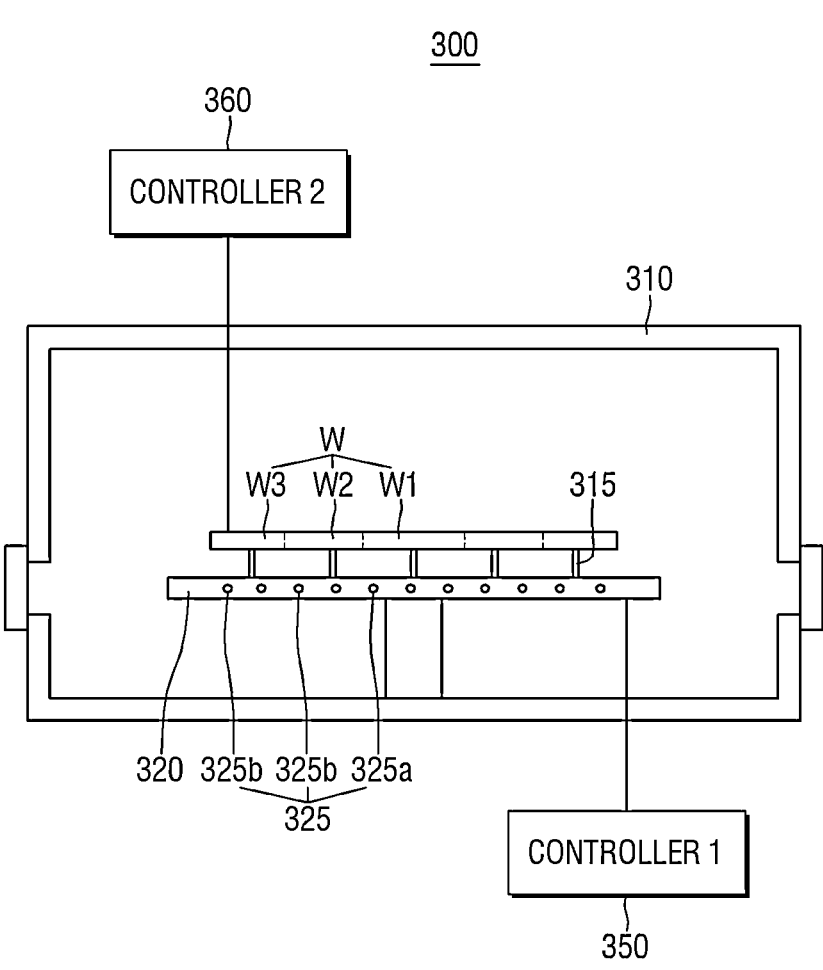
FIG. 11 is an example view for describing a bake unit according to an example embodiment.
Figure 12:
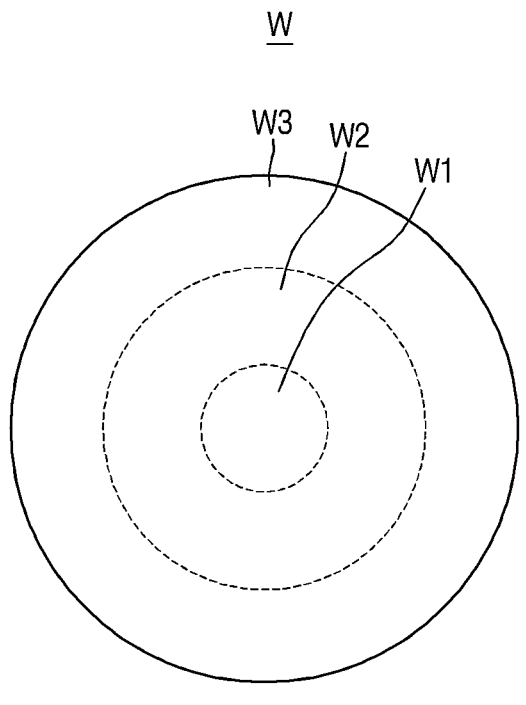
FIG. 12 is a view for describing a substrate of FIG. 11.

FIG. 11 is an example view for describing a bake unit according to an example embodiment. FIG. 12 is a view for describing a substrate of FIG. 11. For convenience of explanation, points different from those described with reference to FIGS. 5 to 6 will be mainly described.

Referring to FIGS. 11 and 12, the substrate W may include a first portion W1, a second portion W2, and a third portion W3. The first portion W1 may be a central portion of the substrate W, and the second portion W2 and the third portion W3 may be edge portions of the substrate W.

The second portion W2 may surround the first portion W1. The third portion W3 may surround the second portion W2. The second portion W2 may be disposed between the first portion W1 and the third portion W3.

In some example embodiments, the heating unit 325 may include a first unit 325*a*, a second unit 325*b*, and a third unit 325*c*. The first unit 325*a* may heat the first portion W1 of the substrate W. The second unit 325*b* may heat the second portion W2 of the substrate W. The third unit 325*c* may heat the third portion W3 of the substrate W.

As the substrate W is divided into the first to third portions W1, W2, and W3, and a heating unit is separately disposed for each portion, the substrate W may be heated to a more uniform temperature. Accordingly, the critical dimension (CD) of the patterns formed on the substrate W in a subsequent process may be uniformly formed.

Figure 13:
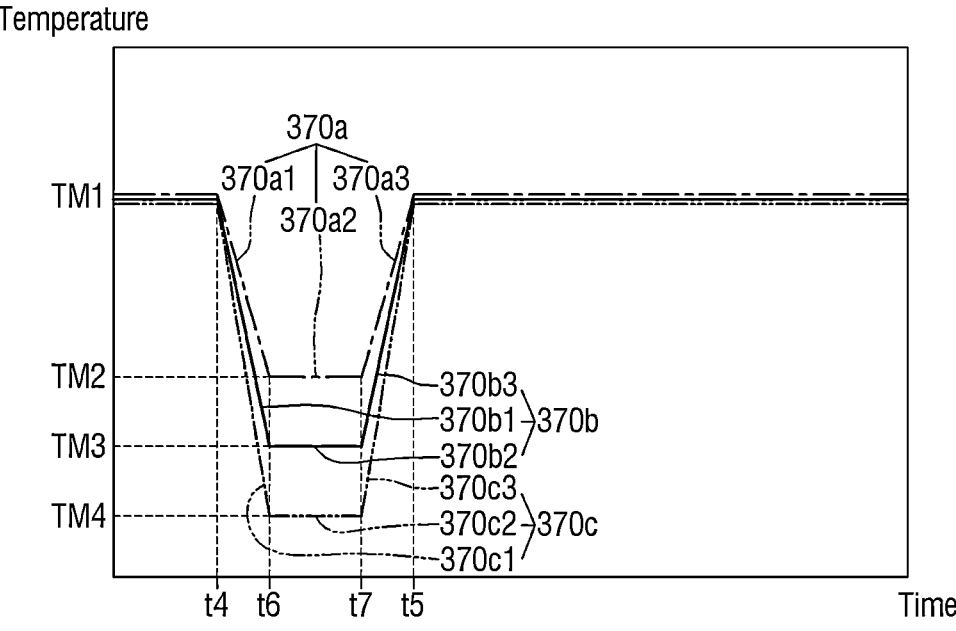
FIG. 13 is an example graph for explaining a heating temperature of the heating unit of FIG. 11.

FIG. 13 is an example graph for explaining a heating temperature of the heating unit of FIG. 11. For convenience of explanation, portions different from those described with reference to FIG. 8 will be mainly described.

Referring to FIG. 13, a first graph 370*a*, a second graph 370*b*, and a third graph 370*c* are provided. The first graph 370*a* may be a graph indicating a first heating temperature at which the first unit 325*a* heats the first portion W1 of the substrate W, the second graph 370*b* may be a graph indicating a second heating temperature at which the second unit 325b heats the second portion W2 of the substrate W, and the third graph 370c may be a graph indicating a third heating temperature at which the third unit 325c heats the third portion W3 of the substrate W.

The first unit 325a may heat the first portion W1 of the substrate W. The first unit 325a may heat the first portion W1 of the substrate W to a first heating temperature. The first heating temperature may have a value between a first temperature TM1 and a second temperature TM2. The second unit 325b may heat the second portion W2 of the substrate W. The second unit 325b may heat the second portion W2 of the substrate W to a second heating temperature. The second heating temperature may have a value between the first temperature TM1 and a third temperature TM3. The third unit 325c may heat the third portion W3 of the substrate W to a third heating temperature. The third heating temperature may have a value between the first temperature TM1 and a fourth temperature TM4.

In some example embodiments, the fourth temperature TM4 may be lower than the third temperature TM3. The fourth temperature TM4 may be lower than the second temperature TM2. That is, the heating temperature when the third portion W3 of the substrate W is heated may be lower than the heating temperatures when the second portion W2 and the first portion W1 of the substrate W are heated.

Because the central portion of the substrate W has a lower temperature than the edge portion of the substrate W, the closer to the central portion of the substrate W, the higher the temperature for heating the substrate W may be applied. Accordingly, the substrate W may be uniformly heated. When the substrate W is uniformly heated, critical dimensions of patterns formed on the substrate W may be uniform.

In some example embodiments, the third heating temperature may have seventh to ninth sub-sections 370c1, 370c2, and 370c3 according to a profile of temperature. The seventh to ninth sub-sections 370c1, 370c2, and 370c3 may be included in the concentration section (the section from the fourth time t4 to the fifth time t5) of the transient section. The seventh sub-section 370c1 may be a section between the fourth time t4 and the sixth time t6. The eighth sub-section 370c2 may be a section between the sixth time t6 and the seventh time t7. The ninth sub-section 370c3 may be a section between the seventh time t7 and the fifth time t5.

In some example embodiments, the third heating temperature may be gradually decreased in the seventh sub-section 370c1. The third heating temperature may be constant in the eighth sub-section 370c2. The third heating temperature may be gradually increased in the ninth sub-section 370c3.

That is, in the seventh sub-section 370c1, the third heating temperature of the third unit 325c may be gradually lowered from the first temperature TM1 to a fourth temperature TM4. In the eighth sub-section 370c2, the third heating temperature of the third unit 325c may be the fourth temperature TM4. In the ninth sub-section 370c3, the third heating temperature of the third unit 325c may gradually increase from the fourth temperature TM4 to the first temperature TM1.

In FIG. 13, it is illustrated that the first sub-section 370a1, the fourth sub-section 370b1, and the seventh sub-section 370c1 completely overlap, the second sub-section 370a2, the fifth sub-section 370b2, and the eighth sub-section 370c2 completely overlap, and the third sub-section 370a3, the sixth sub-section 370b3, and the ninth sub-section 370c3 completely overlap, but the present disclosure is not limited thereto. Depending on the process conditions, the length of each section may be freely changed.

Figure 14:
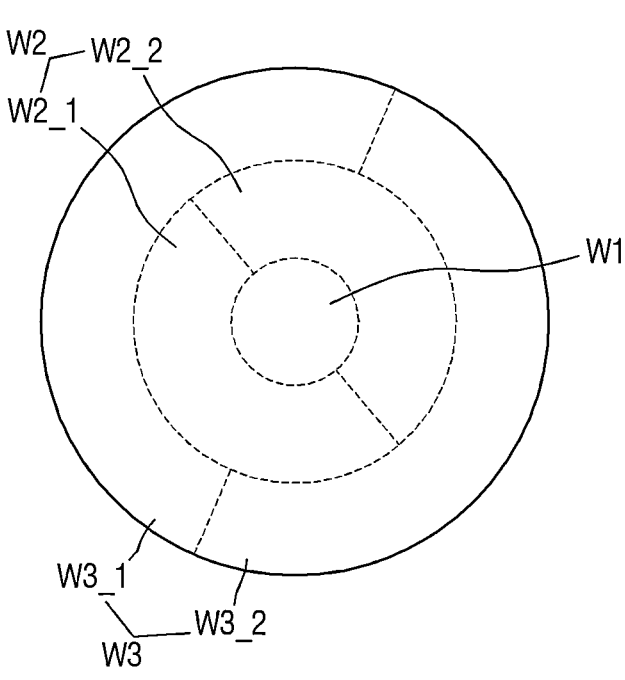
FIGS. 14 and 15 are views for describing substrates according to some example embodiments.
Figure 15:
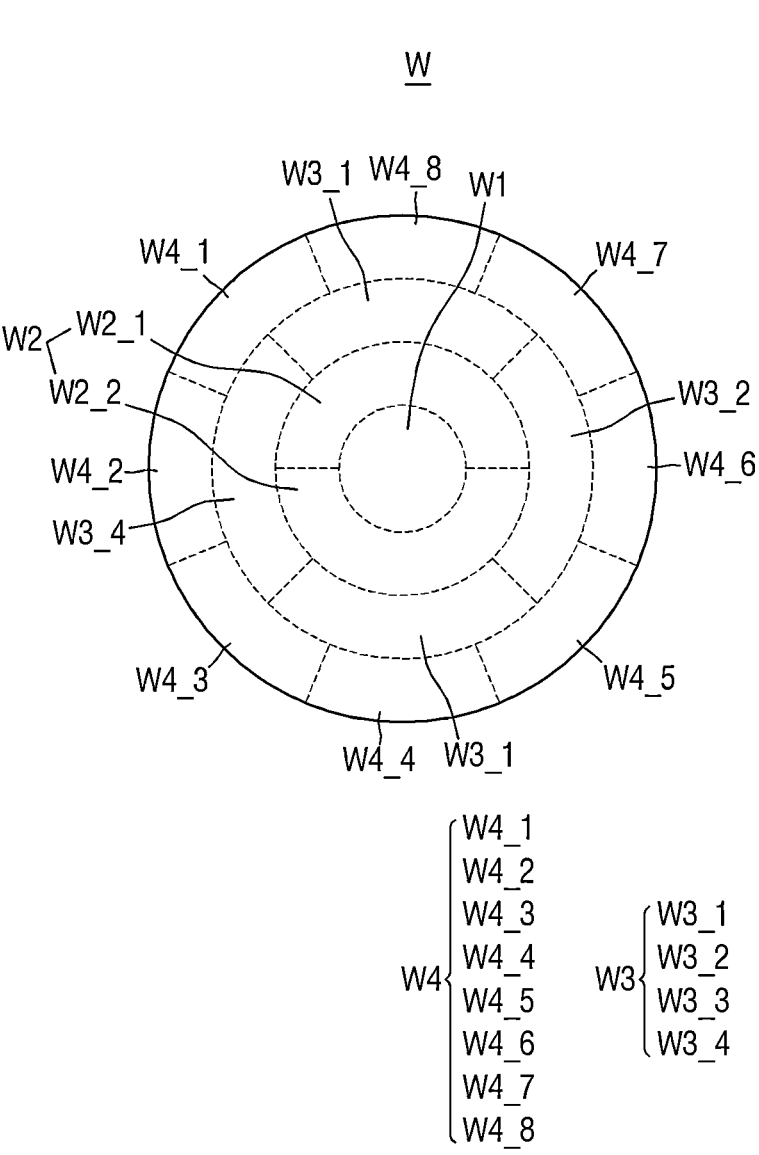

FIGS. 14 and 15 are views for describing substrates according to some example embodiments.

Referring to FIG. 14, the second portion W2 of the substrate W may include a first area W2_1 and a second area W2_2.

As the second portion W2 of the substrate W is divided into the first area W2_1 and the second area W2_2, the second unit 325b may also be divided into a unit that heats the first area W2_1 of the second portion W2 and a unit that heats the second area W2_2 of the second portion W2. That is, a heating temperature of the first area W2_1 of the second portion W2 may be different from a heating temperature of the second area W2_2 of the second portion W2. According to process conditions, the heating temperature of the first area W2_1 of the second portion W2 may be higher or lower than the heating temperature of the second area W2_2 of the second portion W2. In order to more uniformly heat the temperature of the substrate W, the area of the substrate W may be divided, and the heating temperature may be adjusted for each area.

Similarly, the third portion W3 of the substrate W may include a first area W3_1 and a second area W3_2. As the third portion W3 of the substrate W is divided into the first area W3_1 and the second area W3_2, the third unit 325c may also be divided into a unit that heats the first area W3_1 of the third portion W3 and a unit that heats the second area W3_2 of the third portion W3. Accordingly, the substrate W may be more uniformly heated.

Referring to FIG. 15, the substrate W may further include a fourth portion W4. The fourth portion W4 may surround the third portion W3.

The second portion W2 of the substrate W may be divided into a first area W2_1 and a second area W2_2. The third portion W3 of the substrate W may be divided into a first area W3_1, a second area W3_2, a third area W3_3, and a fourth area W3_4. That is, the third portion W3 may be divided into four areas. The fourth portion of the substrate W may be divided into a first area W4_1, a second area W4_2, a third area W4_3, a fourth area W4_4, a fifth area W4_5, a sixth area W4_6, a seventh area W4_7, and an eighth area W4_8. That is, the fourth portion W4 may be divided into eight areas.

The substrate W may be divided into a total of 15 areas. Accordingly, the heating unit 325 may also be divided into a total of 15 areas. The heating temperatures for heating the substrate W for each area may be different from each other. As the divided area of the substrate W increases, the substrate W may be more uniformly heated. Accordingly, the critical dimension (CD) of the patterns formed on the substrate W in a subsequent process may be more uniformly formed.

Figure 16:
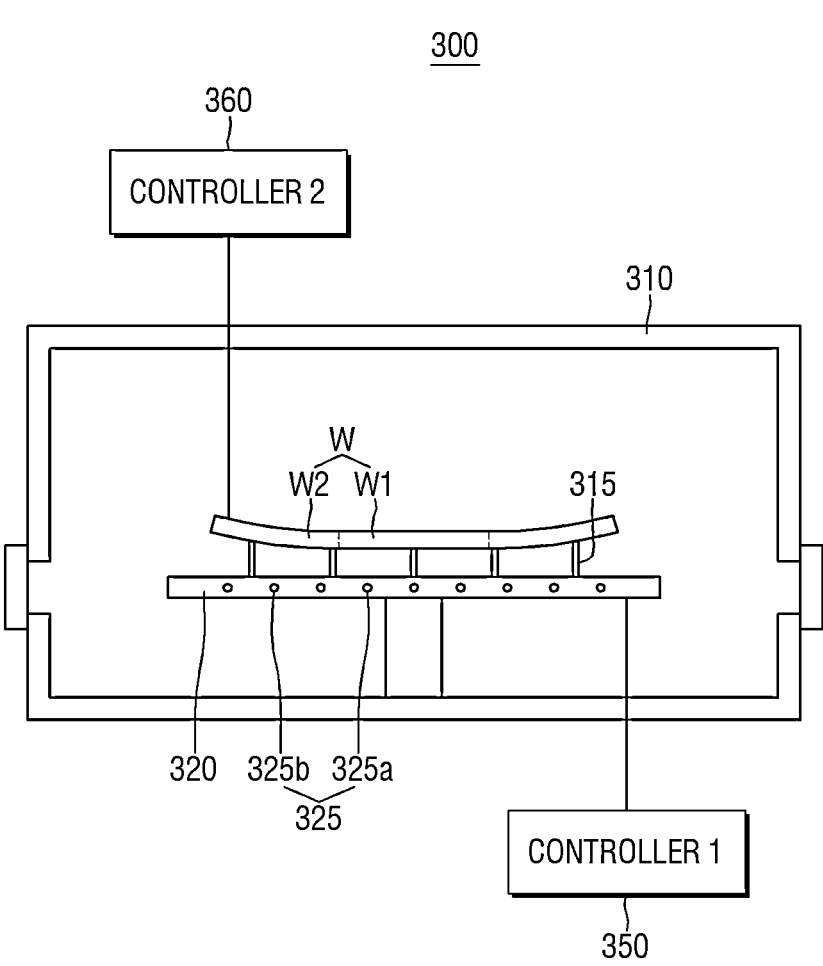
FIG. 16 is an example view for describing a bake unit according to an example embodiment.

FIG. 16 is an example view for describing a bake unit according to an example embodiment. For convenience of explanation, portions different from those described with reference to FIG. 5 will be mainly described.

Referring to FIG. 16, warpage may occur on the substrate W. That is, the substrate W may be curved.

When the substrate W is curved, heat may not be uniformly applied to the substrate W. For example, when the substrate W has a convex shape toward the support plate 320 as illustrated in FIG. 16, heat may be more efficiently applied to the first portion W1 of the substrate W than the second portion W2 of the substrate W. In this case, the second heating temperature of the second unit 325b for heating the second portion W2 of the substrate W may be increased. For example, in FIG. 8, the third temperature TM3 may increase. In this case, the difference between the second temperature TM2 and the third temperature TM3 may be reduced.

The first control unit 350 may adjust the heating temperature of the heating unit 325 according to the degree of warpage of the substrate W. Accordingly, the substrate W having a uniform temperature may be provided.

Figure 17:
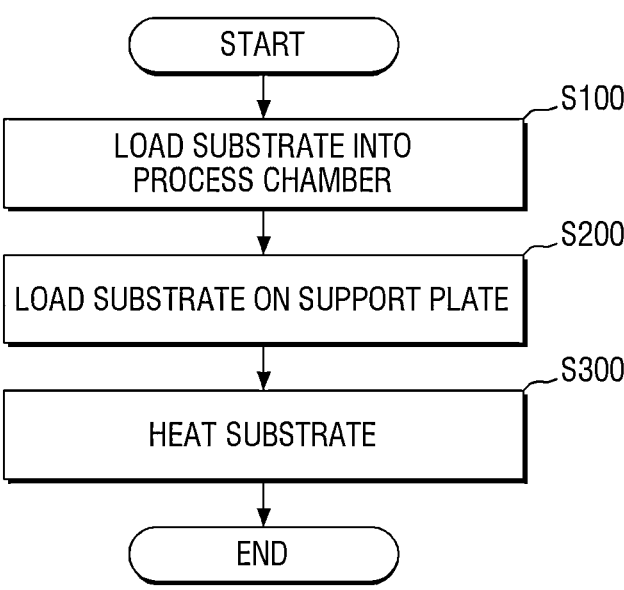
FIG. 17 is a flowchart illustrating a method of manufacturing a semiconductor device using a substrate processing apparatus according to an example embodiment.
Figure 18:
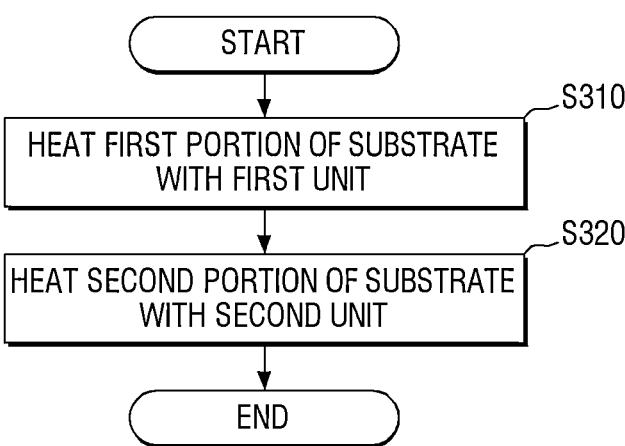
FIG. 18 is a flowchart for explaining step S300 of FIG. 17.

FIG. 17 is a flowchart illustrating a method of manufacturing a semiconductor device using a substrate processing apparatus according to an example embodiment. FIG. 18 is a flowchart for explaining step S300 of FIG. 17.

Referring to FIG. 17, a method of manufacturing a semiconductor device using a substrate processing apparatus according to some example embodiments may include loading a substrate into a process chamber (S100), loading the substrate on a support plate (S200), and heating the substrate (S300).

Referring to FIGS. 4, 5, and 17, the substrate W may be loaded into the process chamber 310 using the carrier robot 340 (S100). For example, the substrate W may be loaded into the substrate processing apparatus 1 (FIG. 1). The carrier robot 340 may hold the loaded substrate W and transfer the substrate W to the process chamber 310. The substrate W may include a first portion W1 and a second portion W2. The first portion W1 may be a central portion of the substrate W, and the second portion W2 may be an edge portion of the substrate W. The second portion W2 may surround the first portion W1.

Subsequently, the substrate W may be loaded on the support plate 320 (S200). The carrier robot 340 may hold the substrate W and place the substrate W on the support plate 320. Subsequently, the support pins 315 may rise to separate the substrate W from the support plate 320.

Referring to FIGS. 5, 8, and 18, the substrate W may be heated (S300). The substrate W may be heated using the heating unit 325 provided in the support plate 320. The heating unit 325 may include a first unit 325*a* and a second unit 325*b*. The first unit 325*a* may heat the first portion W1 of the substrate W (S310). The second unit 325*b* may heat the second portion W2 of the substrate W (S320).

The first unit 325*a* heats the first portion W1 to a first heating temperature. The second unit 325*b* heats the second portion W2 to a second heating temperature. The first heating temperature and the second heating temperature may be different. The first heating temperature may be between the first temperature TM1 and the second temperature TM2. The second heating temperature may be between the first temperature TM1 and the third temperature TM3. The first heating temperature may be greater than the second heating temperature. That is, the first portion W1 of the substrate W is heated to a higher temperature than the second portion W2 of the substrate W. Accordingly, the substrate W having a uniform temperature may be provided.

Any functional blocks (e.g., transfer speed control unit, controller 1, and controller 2) shown in the figures and described above may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In concluding the detailed description, those skilled in the art will appreciate that many variations and modifications may be made to the disclosed example embodiments without substantially departing from the principles of the present disclosure. Therefore, the disclosed example embodiments of the disclosure are used in a generic and descriptive sense only and not for purposes of limitation.

What is claimed is:

1. A substrate processing apparatus comprising:
   a spin unit comprising a coating unit configured to perform a process of coating a photoresist on a substrate, and a developing unit configured to perform a process of developing the substrate;
   a bake unit configured to perform a heat treatment process; and
   a transfer unit between the spin unit and the bake unit,
   wherein the bake unit comprises,
      a process chamber comprising a processing space therein,
      a support plate configured to support the substrate in the process chamber, the substrate comprising a first portion and a second portion surrounding the first portion,
      a heater in the support plate, the heater comprising a first unit configured to heat the first portion of the substrate and a second unit configured to heat the second portion of the substrate, and
      processing circuitry configured to heat the heater in a transient section such that the first unit heats the first portion of the substrate to a first heating temperature, and the second unit heats the second portion of the substrate to a second heating temperature different from the first heating temperature, the transient section being a section before a temperature of the substrate reaches a steady state, a steady section being a section after the temperature of the substrate reaches the steady state, and
   wherein the first heating temperature comprises a first sub-section, a second sub-section and a third sub-section according to a profile of temperature,
   the second heating temperature comprises a fourth sub-section, a fifth sub-section and a sixth sub-section according to a profile of temperature,
   the first heating temperature is constant in the second sub-section,
   the second heating temperature is constant in the fifth sub-section, and
   the processing circuitry configured to heat the first unit and the second unit of the heater in the transient section such that the first heating temperature in the second sub-section is higher than the second heating temperature in the fifth sub-section.

2. The substrate processing apparatus of claim 1, wherein a portion of the fifth sub-section does not overlap the second sub-section.

3. A substrate processing apparatus comprising:
   a process chamber comprising a processing space therein;
   a support plate configured to support a substrate in the process chamber, the substrate comprising a first portion and a second portion surrounding the first portion;
   a heater in the support plate, the heater comprising a first unit configured to heat the first portion of the substrate and a second unit configured to heat the second portion of the substrate; and
   processing circuitry configured to heat the heater in a transient section such that the first unit heats the first portion of the substrate to a first heating temperature, and the second unit heats the second portion of the substrate to a second heating temperature different from the first heating temperature, the transient section being a section before a temperature of the substrate reaches a steady state, a steady section being a section after the temperature of the substrate reaches the steady state, wherein the first heating temperature comprises a first sub-section, a second sub-section and a third sub-section according to a profile of temperature, the second heating temperature comprises a fourth sub-section, a fifth sub-section and a sixth sub-section according to a profile of temperature, the first heating temperature is constant in the second sub-section, the second heating temperature is constant in the fifth sub-section, and the processing circuitry configured to heat the first unit and the second unit of the heater in the transient section such that the first heating temperature in the second sub-section is higher than the second heating temperature in the fifth sub-section.

4. The substrate processing apparatus of claim 3, wherein the first heating temperature is higher than the second heating temperature.

5. The substrate processing apparatus of claim 3, wherein the substrate comprises a third portion between the first portion and the second portion, the heater comprises a third unit configured to heat the third portion of the substrate, in the transient section, the third unit is configured to heat the third portion of the substrate to a third heating temperature, and the third heating temperature is different from the first heating temperature.

6. The substrate processing apparatus of claim 5, wherein in the transient section, the third heating temperature is different from the second heating temperature.

7. The substrate processing apparatus of claim 3, wherein a heating temperature of the heater is constant in the steady section.

8. The substrate processing apparatus of claim 3, wherein in the steady section, the substrate has a first substrate temperature, in the transient section, the substrate has a second substrate temperature, and a difference between the first substrate temperature and the second substrate temperature is 5° C. to 10° C.

9. The substrate processing apparatus of claim 3, wherein the second sub-section and the fifth sub-section completely overlap.

10. The substrate processing apparatus of claim 3, wherein a portion of the fifth sub-section does not overlap the second sub-section.

11. The substrate processing apparatus of claim 3, wherein the first heating temperature gradually decreases in the first sub-section, and the second heating temperature gradually decreases in the fourth sub-section.

12. The substrate processing apparatus of claim 11, wherein the first heating temperature gradually increases in the third sub-section, and the second heating temperature gradually increases in the sixth sub-section.

13. A substrate processing apparatus comprising:

a process chamber comprising a processing space therein;

a support plate configured to support a substrate in the process chamber, the substrate comprising a first portion, a second portion surrounding the first portion, and a third portion between the first portion and the second portion;

a heater provided in the support plate, the heater comprising a first unit configured to heat the first portion of the substrate, a second unit configured to heat the second portion of the substrate, and a third unit configured to heat the third portion of the substrate; and processing circuitry configured to control the heater such that, in a transient section, the first unit heats the first portion of the substrate to a first heating temperature, the second unit heats the second portion of the substrate to a second heating temperature, and the third unit heats the third portion of the substrate to a third heating temperature, the transient section being a section before a temperature of the substrate reaches a steady state, and a steady section being a section after the temperature of the substrate reaches the steady state, wherein the third heating temperature is lower than the first heating temperature, and the third heating temperature is higher than the second heating temperature, and wherein the first heating temperature comprises a first sub-section, a second sub-section and a third sub-section according to a profile of temperature, the second heating temperature comprises a fourth sub-section, a fifth sub-section and a sixth sub-section according to a profile of temperature, the first heating temperature is constant in the second sub-section, the second heating temperature is constant in the fifth sub-section, and the processing circuitry configured to heat the first unit and the second unit of the heater in the transient section such that the first heating temperature in the second sub-section is higher than the second heating temperature in the fifth sub-section.

14. The substrate processing apparatus of claim 13, wherein the processing circuitry is configured to control the heater such that the first unit of the heater increases and then decreases the first heating temperature toward the steady section.

15. The substrate processing apparatus of claim 14, wherein the processing circuitry is configured to control the heater such that the first unit of the heater increases and then decreases the second heating temperature toward the steady section.

16. The substrate processing apparatus of claim 13, wherein the third heating temperature comprises a seventh sub-section, a eighth sub-section and a ninth sub-section according to a profile of temperature, and the third heating temperature is constant in the eighth sub-section.

17. The substrate processing apparatus of claim 16, wherein the second sub-section, the fifth sub-section, and the eighth sub-section completely overlap.

18. The substrate processing apparatus of claim 16, wherein the second sub-section comprises a portion that does not overlap the fifth sub-section or the eighth sub-section.

* * * * *